United States Patent [19]

Leech

[11] 4,287,253

[45] Sep. 1, 1981

[54] CATALYTIC FILLER FOR ELECTROLESS METALLIZATION OF HOLE WALLS

[75] Inventor: Edward J. Leech, Oyster Bay, N.Y.

[73] Assignee: Photocircuits Division of Kollmorgen Corp., Hartford, Conn.

[21] Appl. No.: 566,611

[22] Filed: Apr. 8, 1975

[51] Int. Cl.³ ............................................... C23C 3/02
[52] U.S. Cl. .................................. 428/323; 174/68.5; 427/97; 427/98; 427/215; 427/217; 427/290; 427/304; 427/305; 427/306; 428/324; 428/325; 428/328; 428/329; 428/331; 428/901
[58] Field of Search ................... 427/97, 98, 215, 337, 427/343, 290, 217, 304, 305, 306; 174/68.5; 428/323, 324, 325, 328, 329, 331, 901

[56] References Cited

U.S. PATENT DOCUMENTS

| 2,690,402 | 9/1954 | Crehan | 427/290 |
|---|---|---|---|
| 2,853,398 | 9/1958 | Mackiw et al. | 427/305 |
| 3,171,756 | 3/1965 | Marshall | 427/98 |
| 3,318,711 | 5/1967 | Foulke | 427/98 |
| 3,399,268 | 8/1968 | Schneble | 427/98 |
| 3,546,011 | 12/1970 | Knorre et al. | 427/98 |
| 3,628,999 | 12/1971 | Schneble | 427/97 |
| 3,635,761 | 1/1972 | Haag | 427/217 |
| 3,928,663 | 12/1975 | Redmond | 427/314 |

*Primary Examiner*—John P. Smith
*Attorney, Agent, or Firm*—Morgan, Finnegan, Pine, Foley & Lee

[57] ABSTRACT

Improved catalytic fillers result from the use of hydrazine to render reducible metal salts absorbed on filler material surfaces catalytic to the deposition of electroless metal. Use of such catalytic fillers in forming insulated articles in which holes are made lead to improved electroless metallization of the barrels of such holes.

33 Claims, No Drawings

CATALYTIC FILLER FOR ELECTROLESS METALLIZATION OF HOLE WALLS

In the manufacture of articles having an insulated base in which the metal plating of holes formed in the articles is desired, the walls or barrel of a hole must be rendered catalytic to the deposition of electroless metal if adherent metallization of the hole barrel is to be carried out in an electroless metal deposition bath.

One way of insuring adherent metallization of hole barrels in such circumstances, for example in the manufacture of printed circuit boards, is to form a catalytic filler and incorporate this catalytic filler into a resin used in forming the insulated base of the printed circuit. When holes are formed in such a base, the catalytic filler thereby exposed in the barrels permits adherent metallization of the hole walls upon their contacting with electroless metal deposition baths. See, for example, the disclosures of U.S. Pat. Nos. 3,799,802, 3,259,559 and 3,226,256, which are hereby incorporated herein by reference.

Such catalytic fillers are generally formed by contacting a salt of a noble metal such as palladium, silver, gold, platinum and the like at the surface of a typical filler ordinarily used in resins and plastics, such as aluminum silicate, silica gel, clays such as kaolin and attapulgite, and the like, with a reducing agent. The presently preferred reducing agents of those skilled in the art of rendering salts of noble metals catalytic to adherent metallization are solutions of stannous tin compounds, of which stannous chloride solutions are exemplary.

I have found that the use of the stannous tin reducing agents in catalyzing noble metal salts at the treated surface presents two major undersirable aspects in the above-described catalytic filler art.

First, the manufacture of precious metal catalytic filler in the known preferred manner almost invariably results in detectable amounts of unchanged precious metal salts being present in the final product. The disadvantages of this consequence are several, including the facts that any untreated precious metal compound is "lost," in the sense that it is non-catalytic, and that these residual salts, which are usually chlorides, retard the action of curing agents, such as amines, commonly used in the manufacture of resinous insulating bases incorporating the catalytic filler.

Second, the use of stannous tin reducing agents, such as stannous chloride solutions, results in tin being present in the catalytic filler, and this residual tin content significantly retards the overall catalytic action of the filler in electroless metal deposition baths.

Catalytic fillers formed in accordance with the present invention, which includes contacting the metal salt with a medium comprising hydrazine, result in significantly faster curing times of the resins used in forming insulated bases into which the fillers are usually incorporated. Moreover, use of such catalytic fillers also results in faster electroless metal plating of hole barrels in resinous articles incorporating the fillers when the articles are immersed in electroless metal deposition baths.

Improvements accompanying the practice of the instant invention may be demonstrated by comparing a presently preferred catalytic filler with one manufactured according to the process of this invention.

Prior to the present invention, for example, preferred catalytic fillers of the sort described above were formed by a process including the steps of contacting clay particles with a palladium chloride/hydrochloric acid solution and then contacting the adsorbed palladium salt with a solution comprising stannous chloride, thereby forming a catalytic surface on the filler material, i.e., the clay.

This process results in detectable amounts of palladium chloride being present in the filler, and also results in tin being present in the catalytic filler.

A control catalytic filler according to this method was prepared as follows:

0.68 kg. of polyethylene glycol (Union Carbide "Carbowax 6000") was dissolved in 68 liters of water in a polyethylene-lined drum. 68 kg. of a clay, aluminum silicate (Englehard ASP400P), were added and mixed to form a slurry. 341 ml. of $PdCl_2$/HCl solution (Englehard, 0.241 g/ml palladium) were added, and mixing continued until the slurry took on a uniform color.

In a separate container, 600 ml. of 37% HCl were added to 10 liters of water, and then 2892 gms of anhydrous $SnCl_2$ were added to the aqueous HCl mixture. Upon complete dissolution of the $SnCl_2$, water was added to bring the total volume to 15 liters.

1125 ml. of the stannous chloride solution of the preceding paragraph were then added to the clay/$PdCl_2$ slurry, with mixing continued until the slurry assumed a uniform tan color. The slurry was then spray dried, yielding a gray catalytic filler having a slight tannish cast.

Analysis of the catalytic filler so produced yielded the values of Table I.

TABLE I

| CONTROL | |
|---|---|
| pH | 3.8 |
| Tin Content | 1300 ppm |
| Pd° Content | 950 ppm |
| $PdCl_2$ Content | 390 ppm |

EXAMPLE I

A catalytic filler in accordance with the invention was produced as follows:

0.68 kg. of polyethylene glycol (Union Carbide "Carbowax 6000") was dissolved in 68 liters of water in an inert container (polyethylene-lined drum). 68 kg. of clay (Englehard ASP400P) were added and mixed to form a slurry. 341 ml. of $PdCl_2$/HCl solution (Englehard, 0.241 g/ml palladium) were added, and mixing continued until the slurry assumed a uniform light brown color (about 2–3 minutes). With continued mixing, 85.5 ml of 85% hydrazine hydrate in water were added and the slurry mixed until its color had changed from brown to a uniform gray. The slurry was then spray dried to produce a bone dry ($\leqq 0.1\%$ water) catalytic filler. (The polyethylene glycol is incorporated in the mixture only as a processing aid in the spray drying step.)

The resultant catalytic filler was analyzed and yielded the results of Table II.

TABLE II

| FILLER ACCORDING TO INVENTION | |
|---|---|
| pH | 5.0 |
| Sn Content | None Detected |
| Pd° Content | 1340 ppm |

TABLE II-continued

| FILLER ACCORDING TO INVENTION | |
|---|---|
| PdCl$_2$ Content | None Detected |

As indicated in a comparison of Tables I and II, the catalytic filler of the invention has about 50% more catalytically active palladium, no detectable amount of palladium chloride, and, of course, no tin content. An additional desirable advantage of catalytic filler according to the invention is its higher pH, which permits the use of a lesser amount of resin catalyst in the incorporation of the catalytic filler into an insulated laminate base. Amines are the preferred catalysts of laminators, and the higher pH of the catalytic filler here described permits a significant reduction in the amount of catalyst required to form a resinous laminate incorporating the catalytic filler.

Separate test samples incorporating the control filler and catalytic filler according to the invention were fabricated, including test plugs and two types of laminated insulated bases.

The test plugs were formed by mixing 100 gms epoxy resin (Dow 331), 12 gms methylene dianiline (Naugatuck Chemical Co. "Tonox") as curing agent, and 12 gms catalytic filler and casting the mixture in a cylindrical, two-inch diameter mold.

Laminate samples were fabricated according to the specifications of the FR-2 and FR-4 laminates supplied by NVF Co., in which about 10 weight percent of the resin content is catalytic filler.

Holes having a diameter of 55 mils were drilled in all samples, and the test pieces were immersed in conventional electroless copper deposition baths, as indicated, with the results shown in Table III.

TABLE III

| Sample | Time for Complete Metallization of Holes* (hours) | |
|---|---|---|
| | FILLER ACCORDING TO INVENTION | CONTROL |
| Epoxy Test Plug (Bath No. 1) | 0.5 | 1 |
| FR-4 (Bath No. 1) | 2.5-3 | 4.5-5 |
| FR-2 (Bath No. 1) | 2.5-3 | 3.5-4 |
| FR-4 (Bath No. 2) | 4-5 | Not covered after 8 hrs. |

*Visual observation of the formation of a continous copper coating

EXAMPLE II

A catalytic filler utilizing silver rather than palladium was prepared according to the procedure of Example I, except that 129.5 gms silver nitrate were substituted for the 341 ml. of PdCl$_2$/HCl solution.

Catalytic fillers according to the invention may be formed using any reducible metal compound that is both adsorbed by whatever filler material may be selected and is catalytic to the electroless deposition of metal in its reduced state, including less noble metals, i.e., metals that are more readily oxidized.

The filler material utilized is preferably finely divided, that is, about 90% of the filler will pass through a 325 mesh screen, and preferred filler materials include kaolite and aluminum silicate.

Embodiments of uses of catalytic fillers according to the invention include an insulating resinous material having a catalytic filler dispersed therein and used to impregnate laminae of paper, wood, fiberglass, polyester fibers and other porous materials. These base materials, for example, are immersed in the catalytic resin or the catalytic resin is sprayed onto the base material, after which the base materials are dried in an oven until all the solvent has evaporated. The laminae are then bonded together to form a base of any desired thickness, thereby providing a laminate of the type described impregnated with the catalytic resin.

A further alternative is to pre-form or pre-mold thin films or strips of unpolymerized resin having a catalytic filler therein, and then laminate a plurality of the strips together to form a catalytic insulating base of the desired thickness. In each embodiment, the interior of the insulating base will be catalytic throughout, such that, when holes or apertures are formed therein at any part, the walls of the holes or apertures will be sensitive to the reception of electroless metal from an electroless metal deposition solution such as electroless copper solution.

In making catalytic bases of the type described, wherein the catalytic agent is dispersed in the resin, it is helpful if the catalytic filler is initially dispersed in a suitable solvent prior to incorporation into the resin. The solvent may then be evaporated during curing of the resin.

Catalytic fillers of the type described could also be incorporated into a resin during its manufacture in the form, for example, of a molding powder. The molding powder could then be extruded or otherwise worked to form a plastic article which would be catalytic.

The catalytic insulating base need not be organic. Thus, it could be made of inorganic insulating materials, e.g., inorganic clays and minerals such as ceramic, ferrite, Carborundum, glass, glass-bonded mica, steatite and the like. Here, the catalytic filler would be added to inorganic clays or minerals prior to firing.

The term "catalytic" as used herein refers to an agent or material which is catalytic to the reduction of the metal cations dissolved in electroless metal deposition solutions of the type to be described.

Among the organic materials which may be used to form the catalytic insulating bases described herein may be mentioned thermosetting resins, thermoplastic resins and mixtures of the foregoing.

Among the thermoplastic resins may be mentioned the acetal resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon; polyethylene; polypropylene; polystyrene; styrene blends, such as acrylonitrile-styrene copolymers and acrylonitrile-butadiene-styrene copolymers; polycarbonates; polychlorotrifluoroethylene; and vinyl polymers and copolymers, such as vinyl acetate, vinyl alcohol, vinyl butyral, vinyl chloride, vinyl chloride-acetate copolymer, vinylidene chloride and vinyl formal; and the like.

Among the thermosetting resins may be mentioned allyl phthalate; furane; melamine-formaldehyde; phenol-formaldehyde and phenol-furfural copolymer, alone or compounded with butadiene-acrylonitrile copolymer or acrylonitrile-butadiene-styrene copolymer; polyacrylic esters; silicones; urea formaldehydes; epoxy resins; allyl resins; phenolic resins; glyceryl phthalates; polyesters; and the like.

The catalytic filler, depending upon type, will be present in amounts varying from a small fraction, e.g., 0.0005 to about 80%, usually between about 0.1 to 10%, based upon the combined weight of carrier material and catalyst. The particular concentration used will depend to a large extent upon the material used.

Catalytic insulating bases may be prepared by dispersing the catalytic filler in an insulating material which may in turn be formed into a three-dimensional object, as by molding. The resulting article is catalytic throughout its interior to the reception of electroless metal, so that when holes or apertures are formed in the three-dimensional object, the surrounding walls of the holes are also catalytic. Thus, when such an article containing apertures extending below the surface is contacted with an electroless metal deposition solution, as by immersion therein, electroless metal deposits on the walls surrounding the apertures, and can be built up to any desired thickness.

Although not necessary, hole walls in non-metallic bases incorporating catalytic fillers according to the invention may be rendered polar, or wettable, and microporous to facilitate electroless metal deposition in ways known to those skilled in the art. The hole surface could be microroughened by mechanical means, as by mild abrasion, or by chemical means, as by treatment with chemical solvents, etchants, milling solutions, and the like. A preferred chemical treatment for treating surfaces and improving the electroless metal bond is to contact the surfaces with acids or oxidizing agents, for example, nitric, chromic, and fluoboric acids and mixtures thereof, and permanganates and the like.

Typically, the autocatalytic or electroless metal deposition solutions for use with catalytic insulating bases of the type described comprise an aqueous solution of a complex or chelate of the metal or metals to be deposited and a reducing agent. Complexing or sequestering agents are used to form a water soluble complex with cations of the metal(s) to be deposited so as to maintain the metal(s) in solution.

Typical of such solutions are electroless copper, electroless nickel and electroless gold plating solutions. Such solutions are well known in the art and are capable of autocatalytically depositing the identified metals without the use of an external source of electricity.

Electroless copper plating solutions which may be used are described in U.S. Pat. No. 3,095,309, the description of which is incorporated herein by reference. Conventionally, such solutions comprise a source of cupric ions, e.g., copper sulfate, a reducing agent, e.g., formaldehyde, a complexing agent, e.g., tetrasodium ethylenediaminetetraacetic acid, and a pH adjustor, e.g., sodium hydroxide.

Electroless nickel baths which may be used are described in Brenner, "Metal Finishing," November 1954, pages 68 to 76, incorporated herein by reference. They comprise aqueous solutions of a nickel salt, such as nickel chloride; an active chemical reducing agent for the nickel salt, such as the hypophosphite ion; and a complexing agent, such as carboxylic acids and salts thereof.

Electroless gold plating baths which may be used are disclosed in U.S. Pat. No. 2,976,181, hereby incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid and salts thereof, such as the sodium, calcium and the ammonium salts. The purpose of the complexing agent is to maintain a relatively small portion of the gold in solution as a water soluble gold complex, permitting a relatively large portion of the gold to remain out of solution as a gold reserve. The pH of the bath will be about 13.5, or between about 13 and 14, and the ion ratio of hypophosphite radical to insoluble gold salt may be between about 0.33 and 10 to 1.

The most preferred used of catalytic fillers according to the invention is their incorporation into insulated laminated bases as previously described. The catalytic bases so formed are then most preferably utilized in the manufacture of printed circuit boards which include metallized hole walls, as described herein and as well known to those skilled in the art.

A preferred overall process would then include the manufacture of a catalytic filler according to the invention, incorporation of the filler into an insulated base, the formation of holes in the catalytic base, and metallization of the hole barrels in electroless metal deposition baths. Where other portions of the article are also to be metallized, and pretreatment of these other areas, such as with chromic or permanganate baths is necessary to promote adherent electroless metallization, hole barrels as described may also be contacted with such treating solutions and subsequently metallized.

Palladium and silver are the preferred metals for use in the catalytic filler, with the former being most preferred, epoxy resin is the preferred agent for effecting a dispersion of the catalytic filler in an insulated base, an epoxy resin/fiberglass laminate is the preferred insulating base, and copper is the preferred electroless metal to be plated on the hole walls.

I claim:

1. In a process for making a filler material that is catalytic to the deposition of electroless metal, the improvement which comprises the steps:
    a. adsorbing a reducible metal compound from a liquid medium comprising said compound on to the surface of a filler material;
    b. rendering said adsorbed compound catalytic to the deposition of electroless metal by contacting said adsorbed compound with hydrazine; and
    c. incorporating the catalytic filler so formed into the formation of an insulating article.

2. A process according to claim 1, wherein said hydrazine is in the form of an aqueous solution of hydrazine hydrate.

3. A process according to claim 1, wherein said liquid medium comprises a salt of at least one noble metal.

4. A process according to claim 3, wherein said noble metal consists of at least one member of the group consisting of palladium and silver.

5. A process according to claim 4, wherein said liquid medium comprises palladium chloride.

6. A process according to claim 4, wherein said filler material comprises a finely divided clay.

7. A process according to claim 6, wherein said finely divided clay is kaolin.

8. A process according to claim 7, wherein said finely divided clay is aluminum silicate.

9. A process according to claim 4, including the additional step of drying the catalytic filler resulting from step b.

10. A process according to claim 1, wherein step c. comprises the steps:

(1) dispersing said catalytic filler in a resinous material; and
(2) utilizing the catalytic resin so formed in creating a laminated article.

11. A process according to claim 10, wherein said resinous material comprises epoxy resin and said laminated article comprises an epoxy resin/fiberglass laminate.

12. A process according to claim 11, wherein said finely divided filler material is a clay.

13. A process according to claim 12, wherein step c. (1) comprises dispersing about 10 weight percent of said catalytic filler in said epoxy resin, based upon the weight of said epoxy resin.

14. A process for making an insulated article that is catalytic throughout to the deposition of electroless metal, comprising the steps:
  (a). adsorbing palladium chloride from a liquid medium on to the surface of finely divided clay;
  (b). catalyzing said adsorbed palladium chloride to the deposition of electroless metal by contacting with an aqueous solution comprising hydrazine;
  (c). drying the resultant catalytic filler;
  (d). mixing said catalytic filler with a resinous material; and
  (e). forming a catalytic insulated article incorporating the resultant catalytic resinous material.

15. An improved process for electrolessly metallizing holes formed in insulated articles, said process comprising the steps:
  (a). adsorbing at least one compound of at least one metal selected from the group consisting of palladium and silver from a liquid medium containing said compound on to the surface of a finely divided filler material;
  (b). rendering the compound so adsorbed catalytic to the deposition of electroless metal by contacting said adsorbed compound with an aqueous solution comprising hydrazine;
  (c). incorporating the catalytic filler so formed into the formation of an insulated article;
  (d). forming at least one hole in the catalytic insulated article so formed; and
  (e). contacting the barrel of said hole with an electroless metal deposition solution.

16. A process according to claim 15, including the additional step of rendering the barrel of said hole microporous and wettable, said step occurring between steps d. and e.

17. A process according to claim 16, wherein step a. comprises the adsorption of palladium chloride by said filler material.

18. A process according to claim 17, wherein said filler material is a clay.

19. A process according to claim 18, wherein step c. comprises the steps:
  (1) dispersing said catalytic filler in a resinous material; and
  (2) utilizing the catalytic resin so formed in the formation of a catalytic, laminated, insulated article.

20. An insulated article comprising at least one metallized hole barrel according to claim 15.

21. A process for electrolessly metallizing holes formed in insulated articles, comprising the steps:
  a. adsorbing palladium chloride from a liquid medium on to the surface of finely divided clay;
  b. catalyzing said adsorbed palladium chloride to the deposition of electroless metal by contacting with an aqueous solution comprising hydrazine;
  c. drying the resultant catalytic filler;
  d. mixing said catalytic filler with a resinous material;
  e. forming a catalytic insulated article incorporating the resultant catalytic resinous material;
  f. forming at least one hole in said catalytic insulated article; and
  g. metallizing the barrel of said hole by contacting with an electroless metal deposition bath.

22. A process for making an electrically insulating article that is catalytic throughout to the deposition of electroless copper from an electroless metal plating bath comprising a copper compound, a reducing agent and a complexing agent, said process comprising the steps:
  a. adsorbing a compound of a noble metal from a liquid medium comprising said compound on to the surface of a finely divided filler material;
  b. rendering the adsorbed compound catalytic to the deposition of electroless copper by contacting said adsorbed compound with an aqueous solution comprising hydrazine; and
  c. incorporating the catalytic filler so formed into the formation of an insulating article.

23. A catalytic insulated article according to claim 22.

24. A process according to claim 22, wherein said noble metal consists of at least one member of the group consisting of palladium and silver.

25. A process according to claim 24, wherein step c. comprises the steps:
  (1) dispersing said catalytic filler in a resinous material; and
  (2) utilizing the catalytic resin so formed in creating a laminated article.

26. A process according to claim 25, wherein said compound of a noble metal is palladium chloride.

27. A process according to claim 26, wherein said resinous material comprises epoxy resin and said laminated article comprises an epoxy resin/fiberglass laminate.

28. A process according to claim 27, wherein said finely divided filler material is a clay.

29. An improved process for electroless depositing copper on the surface of holes formed in insulated article, said process comprising the steps:
  a. adsorbing at least one compound of at least one metal selected from the group consisting of palladium and silver from a liquid medium containing said compound on to the surface of a finely divided filler material;
  b. rendering the compound so adsorbed catalytic to the deposition of electroless copper by contacting said adsorbed compound with an aqueous solution comprising hydrazine;
  c. incorporating the catalytic filler so formed into the formation of an insulated article;
  d. forming at least one hole in the catalytic insulated article so formed; and
  e. contacting the barrel of said hole with an electroless metal deposition solution comprising a copper compound, a reducing agent and a complexing agent.

30. An insulated article comprising at least one metallized hole barrel according to claim 29.

31. A process according to claim 29, including the additional step of rendering the barrel of said hole microporous and wettable, said step occurring between steps d. and e.

32. A process according to claim 31, wherein step a. comprises the adsorption of palladium chloride by said filler material.

33. A process according to claim 32, wherein said filler material is a clay.

* * * * *